(12) United States Patent
Hwang et al.

(10) Patent No.: US 8,754,913 B2
(45) Date of Patent: Jun. 17, 2014

(54) SUBPIXEL ARRANGEMENT STRUCTURE OF DISPLAY DEVICE

(75) Inventors: Soonjae Hwang, Gumi-si (KR); Jongsik Shim, Seoul (KR); Homin Lim, Paju-si (KR); Minkyu Chang, Seoul (KR); Kyoungsik Choi, Daejeon (KR); Thomas Lloyd Credelle, Morgan Hill, CA (US)

(73) Assignee: LG Display Co., Ltd., Seoul (KR)

( * ) Notice: Subject to any disclaimer, the term of this patent is extended or adjusted under 35 U.S.C. 154(b) by 468 days.

(21) Appl. No.: 13/084,937

(22) Filed: Apr. 12, 2011

(65) Prior Publication Data

US 2011/0260951 A1 Oct. 27, 2011

Related U.S. Application Data

(60) Provisional application No. 61/326,457, filed on Apr. 21, 2010.

(51) Int. Cl.
*G09G 5/02* (2006.01)

(52) U.S. Cl.
USPC .............. 345/694; 345/55; 345/695; 345/698

(58) Field of Classification Search
USPC .................................... 345/55, 694, 695, 698
See application file for complete search history.

(56) References Cited

U.S. PATENT DOCUMENTS

| | | | |
|---|---|---|---|
| 2003/0071943 A1* | 4/2003 | Choo et al. ..................... | 349/106 |
| 2004/0212633 A1* | 10/2004 | Natori et al. .................. | 345/694 |
| 2006/0170712 A1* | 8/2006 | Miller et al. .................. | 345/695 |
| 2006/0274090 A1* | 12/2006 | Koyama et al. ............... | 345/695 |
| 2008/0297541 A1* | 12/2008 | Credelle ....................... | 345/694 |
| 2010/0149228 A1* | 6/2010 | Han et al. ..................... | 345/694 |

* cited by examiner

*Primary Examiner* — Amare Mengistu
*Assistant Examiner* — Gloryvid Figueroa-Gibson
(74) *Attorney, Agent, or Firm* — Birch, Stewart, Kolasch & Birch, LLP

(57) ABSTRACT

A subpixel arrangement structure for a display device, including a plurality of unit pixels each having a red subpixel, a green subpixel and a blue subpixel which form a delta arrangement structure, wherein openings of the red and green subpixels of each unit pixel are substantially aligned along a direction of a column axis, wherein an opening of the blue subpixel of each until pixel are substantially aligned along the direction of the column axis or a direction of a row axis that is perpendicular to the column axis, and wherein two of the plurality of unit pixels of each pixel group, that are positioned adjacent to each other in the direction of the column axis or the direction of the row axis, share one blue subpixel with each other.

12 Claims, 10 Drawing Sheets (A) Existing RGB delta structure (B) Existing RGBG structure

SUBPIXEL ARRANGEMENT STRUCTURE OF DISPLAY DEVICE

This application claims priority to and the benefit of U.S. Provisional Application No. 61/326,457 filed in the United States Patent and Trademark Office on Apr. 15, 2010, the entire contents of which are incorporated herein by reference.

BACKGROUND OF THE INVENTION

1. Field of the Invention

Embodiments of the invention relate to a subpixel arrangement structure of a display device.

2. Discussion of the Related Art

Examples of a display device include a cathode ray tube (CRT), a liquid crystal display (LCD), an organic light emitting diode (OLED) display, and a plasma display panel (PDP).

An active matrix type organic light emitting diode (AMOLED) display includes an organic light emitting diode (OLED) element having a self-emitting structure, and thus has advantages such as a fast response time, excellent or improved light emitting efficiency, a high luminance, and a wide viewing angle. The AMOLED display controls a current flowing in an OLED (or the OLED element) using thin film transistors (TFTs), to thereby displaying an image.

The AMOLED display generally includes a plurality of red, green, and blue subpixels, so as to achieve a full color display. A RGB stripe structure illustrated in FIG. 1 is known as an arrangement structure of the subpixels of the AMOLED display.

As shown in FIG. 1, each of unit pixels formed on a display panel 10 includes a red subpixel SPR, a green subpixel SPG, and a blue subpixel SPB, which are positioned adjacent to one another in a horizontal direction. The red, green, and blue subpixels SPR, SPG, and SPB are arranged in a stripe shape and are partitioned by a black region 11. OLEDs of the red, green, and blue subpixels SPR, SPG, and SPB have a red light emitting layer, a green light emitting layer, and a blue light emitting layer, respectively. The red, green, and blue light emitting layers of the red, green, and blue subpixels SPR, SPG, and SPB are separately deposited through a fine metal mask (FMM) method using a shadow mask.

The FMM method requires a process margin of a predetermined distance between the adjacent red, green, and blue subpixels SPR, SPG, and SPB. As a resolution of the display panel 10 increases, a distance between the subpixels decreases. Therefore, opening areas of the subpixels has to decrease so as to secure the process margin. However, when the opening areas decreases, an aperture ratio and a luminance of the display panel 10 are entirely reduced. Accordingly, because the display panel 10 having the RGB stripe structure has a high resolution limit, a new arrangement structure of subpixels has been demanded.

SUMMARY OF THE INVENTION

Embodiments of the invention provide a subpixel arrangement structure of a flat panel display device capable of increasing an aperture ratio and a luminance at a high resolution.

Embodiments of the invention also provide a subpixel arrangement structure of a flat panel display device capable of preventing a reduction in display quality while increasing an aperture ratio and a luminance.

In one aspect, there is a subpixel arrangement structure for a display device, including a plurality of unit pixels each having a red subpixel, a green subpixel and a blue subpixel which form a delta arrangement structure, wherein openings of the red and green subpixels of each unit pixel are substantially aligned along a direction of a column axis, wherein an opening of the blue subpixel of each until pixel are substantially aligned along the direction of the column axis or a direction of a row axis that is perpendicular to the column axis, and wherein two of the plurality of unit pixels of each pixel group, that are positioned adjacent to each other in the direction of the column axis or the direction of the row axis, share one blue subpixel with each other.

In another aspect, there is a display device, including a plurality of pixel groups, each pixel group including four unit pixels, including ten subpixels, each unit pixel forms a delta arrangement structure including red, green, and blue subpixels, wherein openings of the red and green subpixels of the each unit pixel are aligned along a direction of a column axis, wherein an opening of the blue subpixel of the each unit pixel are aligned along the direction of the column axis or a direction of a row axis that is perpendicular to the column axis, and wherein two of the plurality of unit pixels that are positioned adjacent to each other in the direction of the column axis or the direction of the row axis, share one blue subpixel with each other.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to embodiments of the invention examples of which are illustrated in the accompanying drawings.

Figure 1:
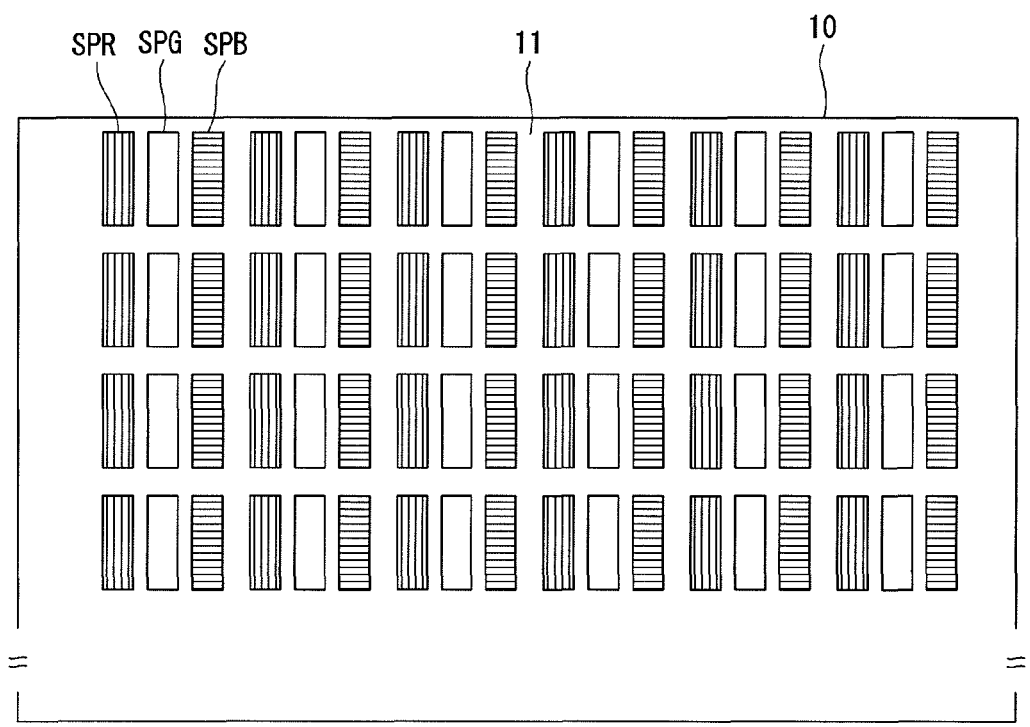
FIG. 1 illustrates a related art RGB stripe arrangement structure of subpixels.
Figure 2:
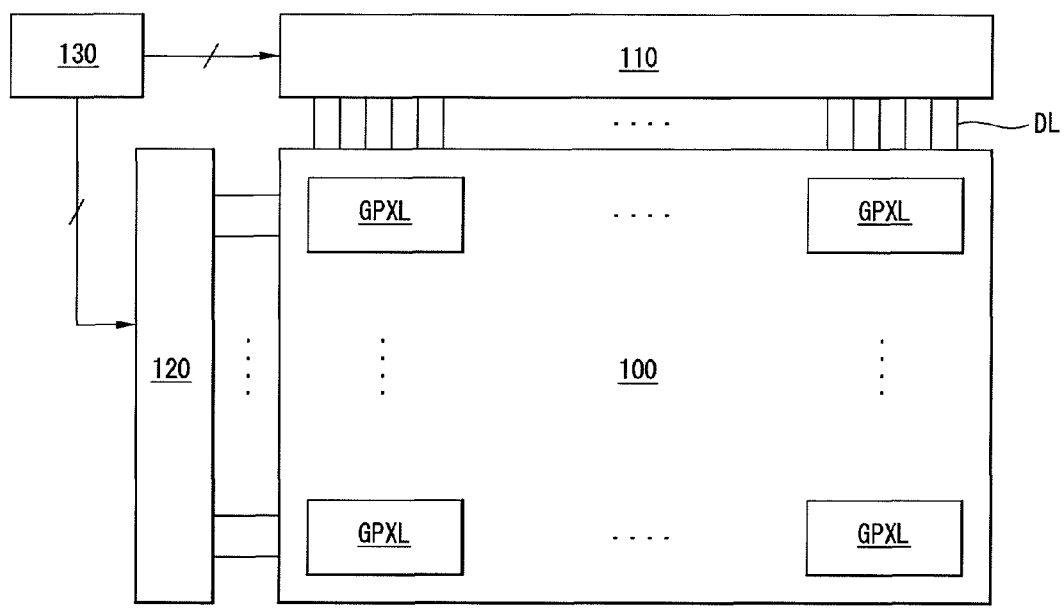
FIG. 2 schematically illustrates a flat panel display device according to an example embodiment of the invention.

FIG. 2 schematically illustrates a flat panel display device according to an example embodiment of the invention.

As shown in FIG. 2, a flat panel display device according to an example embodiment of the invention includes a display panel 100, a data driving circuit 110, a gate driving circuit 120, and a timing controller 130.

The display panel 100 may be implemented by an organic light emitting diode (OLED) panel. Further, the display panel 100 applicable to the example embodiment of the invention may be implemented by a liquid crystal display panel, a plasma display panel, and an electrophoresis display panel.

The display panel 100 includes a plurality of pixel groups GPXL. Each pixel group GPXL includes four unit pixels (=two unit pixels×two unit pixels). Each of first to fourth unit pixels constituting one pixel group GPXL includes three subpixels (i.e., red, green, and blue subpixels) having a delta arrangement structure, so as to have an increased or improved aperture ratio.

In at least one pixel group GPXL, two unit pixels positioned adjacent to each other in a direction of a row axis or a column axis share one blue subpixel with each other. In other words, each pixel group GPXL includes 10 subpixels, and the 10 subpixels of each pixel group GPXL constitute four unit pixels each having the delta structure. A plurality of data lines DL (for example, 6 data lines) and a plurality of gate lines GL (for example, 2 gate lines) may be assigned to each pixel group GPXL.

The red subpixel includes a red OLED having a red light emitting layer, the green subpixel includes a green OLED having a green light emitting layer, and the blue subpixel includes a blue OLED having a blue light emitting layer. The OLED further includes a first electrode (for example, a cathode electrode) stacked on the light emitting layer and a second electrode (for example, an anode electrode) stacked under the light emitting layer. The OLED emits light in a top emission type fashion. The light emitting layer emits light by a driving current applied from a thin film transistor (TFT) array via the second electrode.

Openings of 4 red subpixels and 4 green subpixels among 10 subpixels of one pixel group GPXL are aligned along a direction of a column axis (refer to FIGS. 3 and 5 to 9). Openings of 2 blue subpixels among the 10 subpixels are aligned along a direction of a row axis (refer to FIGS. 3 and 5 to 7) or are aligned along the direction of the column axis (refer to FIGS. 8 and 9). In the embodiment of the invention, an opening indicates a display area of an image displayed by light produced in the light emitting layer.

The data driving circuit 110 includes a plurality of source driver integrated circuits (ICs) and drives the data lines DL of the display panel 100. The data driving circuit 110 converts input digital video data into a data voltage under the control of the timing controller 130 and supplies the data voltage to the data lines DL. The data voltage is applied to the TFT array through the data lines DL and determines a driving current, which is supplied from a driving element to the second electrode.

The gate driving circuit 120 includes at least one gate driver IC and sequentially supplies a scan pulse (or a gate pulse) to the gate lines GL of the display panel 100. In a gate in panel (GIP) manner, the gate driving circuit 120 may include a shift register formed on the display panel 100.

The timing controller 130 receives a plurality of timing signals from an external system (not shown) and generates control signals for controlling operation timings of the data driving circuit 110 and the gate driving circuit 120. The timing controller 130 receives the digital video data from the external system and supplies the digital video data to the data driving circuit 110.

Figure 3:
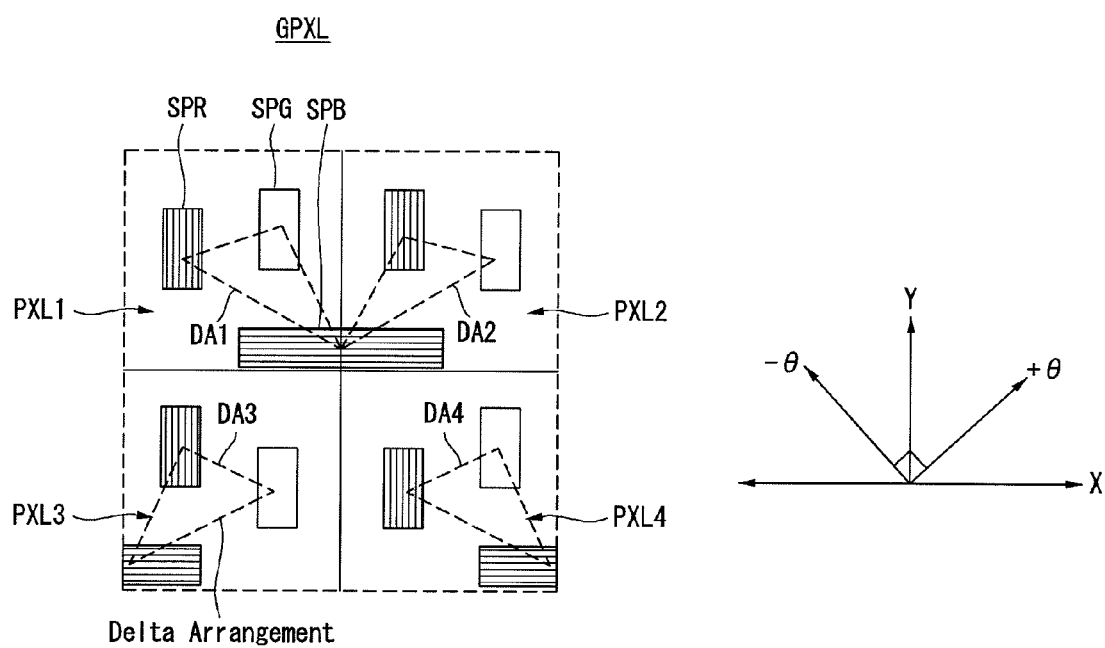
FIG. 3 illustrates one pixel group of a flat panel display device according to a first example embodiment of the invention.

FIG. 3 illustrates one pixel group of a flat panel display device according to a first example embodiment of the invention.

As shown in FIG. 3, a pixel group GPXL includes a first unit pixel PXL1, a second unit pixel PXL2 positioned adjacent to the first unit pixel PXL1 in a direction of a row axis (i.e., X-axis direction), a third unit pixel PXL3 positioned adjacent to the first unit pixel PXL1 in a direction of a column axis (i.e., Y-axis direction), and a fourth unit pixel PXL4 positioned adjacent to the second unit pixel PXL2 in the Y-axis direction.

The first unit pixel PXL1 includes a red subpixel SPR, a green subpixel SPG positioned at the lateral side of the red subpixel SPR, and a first blue shared subpixel SPB positioned at the lower side of the green subpixel SPG, thereby forming a first delta arrangement DA 1.

The second unit pixel PXL2 includes a red subpixel SPR, a green subpixel SPG positioned at the lateral side of the red subpixel SPR, and the first blue shared subpixel SPB positioned at the lower side of the red subpixel SPR, thereby forming a second delta arrangement DA2.

The third unit pixel PXL3 includes a red subpixel SPR, a green subpixel SPG positioned at the lateral side of the red subpixel SPR, and a second blue shared subpixel SPB positioned at the lower side of the red subpixel SPR, thereby forming a third delta arrangement DA3. The third delta arrangement DA3 is substantially the same as the second delta arrangement DA2.

The fourth unit pixel PXL4 includes a red subpixel SPR, a green subpixel SPG positioned at the lateral side of the red subpixel SPR, and a third blue shared subpixel SPB positioned at the lower side of the green subpixel SPG, thereby forming a fourth delta arrangement DA4. The fourth delta arrangement DA4 is substantially the same as the first delta arrangement DA1.

Figure 5:
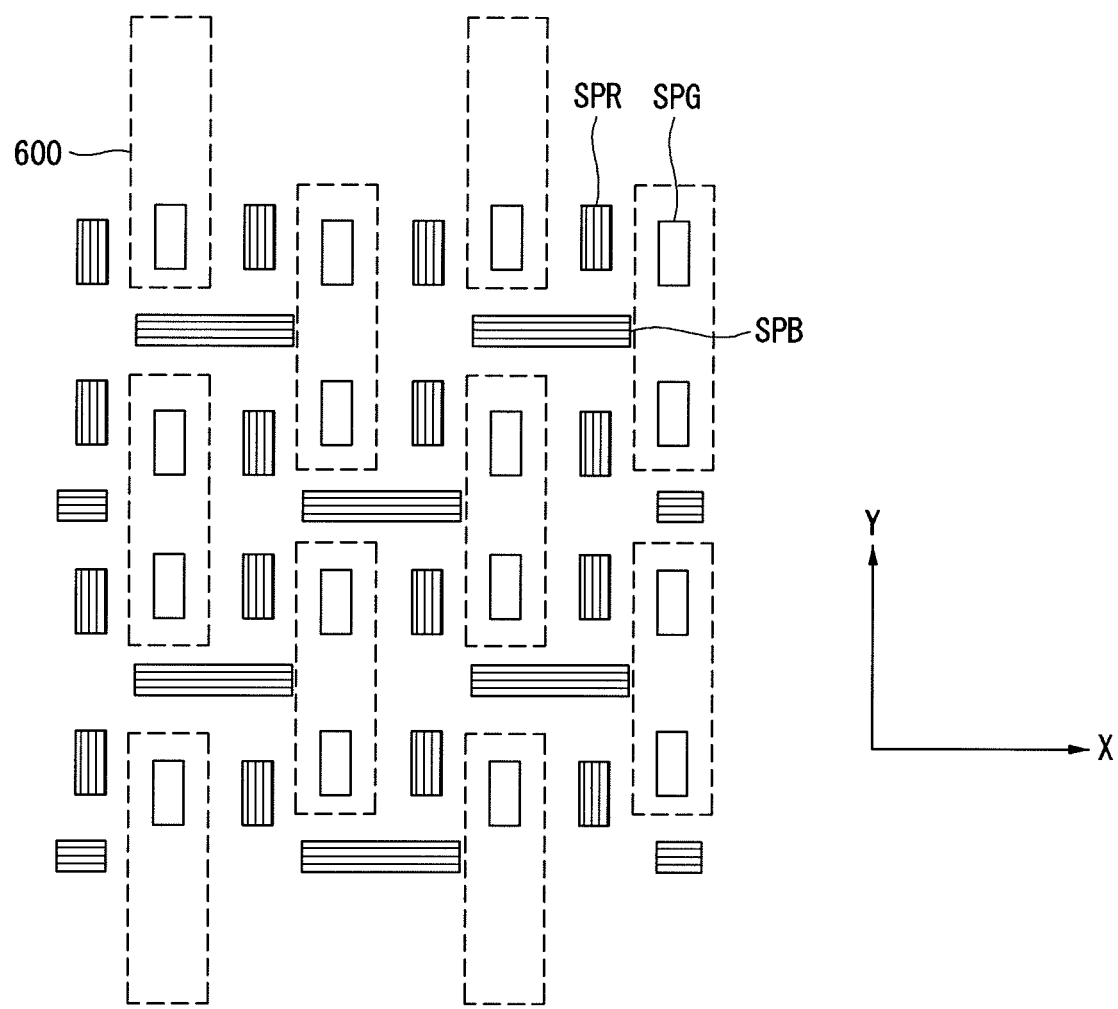
FIG. 5 illustrates an opening of a shadow mask aligned in a direction of a column axis for forming a green light emitting layer using a fine metal mask (FMM) method.
Figure 6:
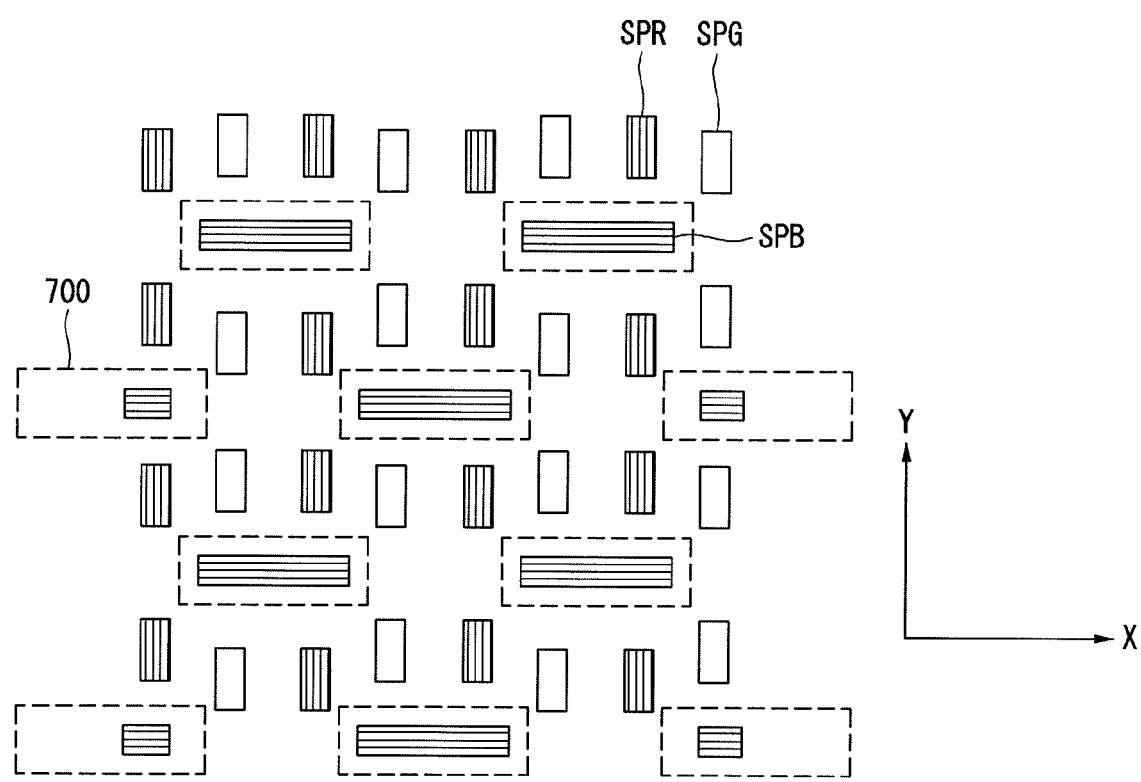
FIG. 6 illustrates an opening of a shadow mask aligned in a direction of a row axis for forming a blue light emitting layer using a fine metal mask (FMM) method.

In the first to fourth unit pixels PXL1-PXL4, the red and green subpixels SPR and SPG may have a rectangular shape in which long sides thereof are positioned in the Y-axis direction, and the blue shared subpixels SPB may have a rectangular shape in which long sides thereof are positioned in the X-axis direction. The sizes of the blue shared subpixels SPB are about two times greater than the sizes of the red and green subpixels SPR and SPG. Unit pixels of other pixel groups sharing the second and third blue shared subpixels SPB are omitted in FIG. 3 for the sake of brevity. For example, FIGS. 5 and 6 illustrate unit pixels of other pixel groups sharing the second and third blue shared subpixels SPB substantially having the same size as the first blue shared subpixel SPB.

The first to fourth delta arrangements DA1-DA4 are obtained by virtually connecting central points (or internal points) of the red, green, and blue subpixels SPR, SPG, and SPB of each of the first to fourth delta arrangements DA1-DA4 to one another. A reason to arrange the subpixels of each of the first to fourth unit pixels PXL1-PXL4 in the delta structure is to increase the aperture ratio. In the embodiment of the invention, because two unit pixels positioned adjacent to each other in the X-axis direction share one blue subpixel with each other, the number of blue subpixels decreases. Hence, the number of TFTs and the number of signal lines required to constitute the blue subpixels decrease. As a result, the aperture ratio further increases.

The first and fourth delta arrangements DA1 and DA4 of the first and fourth unit pixels PXL1 and PXL4 are substantially the same as each other in a direction of a first inclined axis (i.e., −θ-axis direction). The second and third delta arrangements DA2 and DA3 of the second and third unit pixels PXL2 and PXL3 are substantially the same as each other in a direction of a second inclined axis (i.e., +θ-axis direction) perpendicular to the first inclined axis. Thus, the first and fourth unit pixels PXL1 and PXL4 have translational symmetry in the direction of the first inclined axis (i.e., −θ-axis direction), and the second and third unit pixels PXL2 and PXL3 have translational symmetry in the direction of the second inclined axis (i.e., +θ-axis direction).

Further, the first and second delta arrangements DA1 and DA2 of the first and second unit pixels PXL1 and PXL2 form the line symmetry with respect to the Y-axis direction. The third and fourth delta arrangements DA3 and DA4 of the third and fourth unit pixels PXL3 and PXL4 form the line symmetry with respect to the Y-axis direction.

Figure 4:
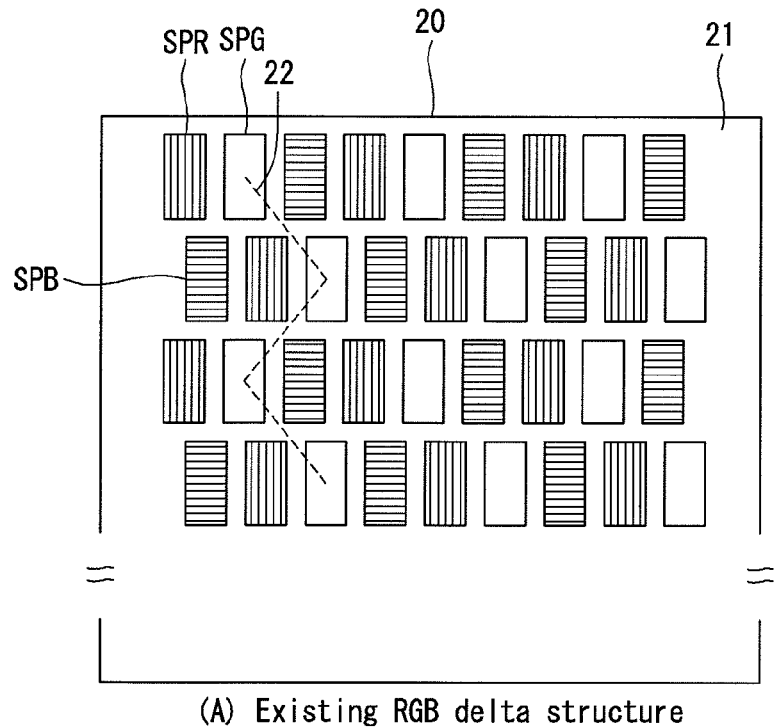
FIG. 4 illustrates an existing RGB delta structure and an existing RGBG subpixel arrangement structure.
Figure 4:
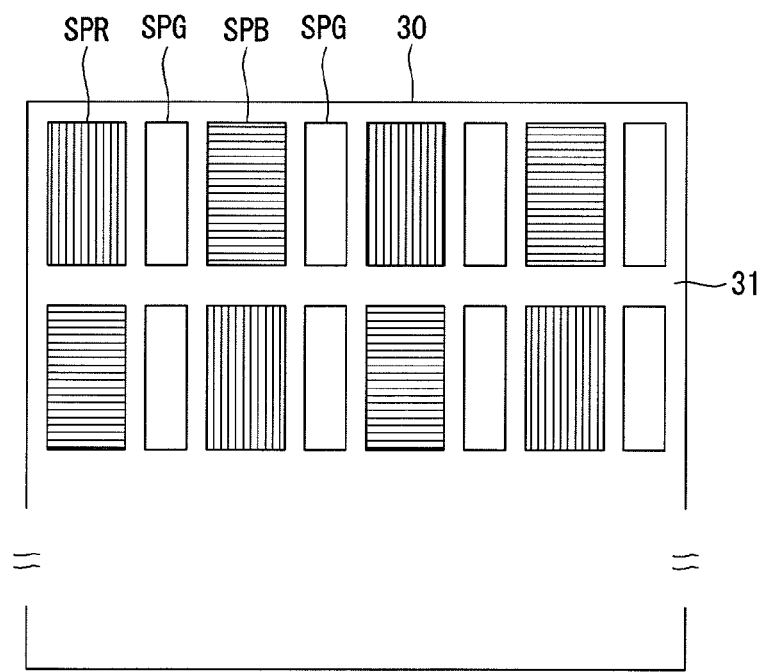

An RGB delta structure shown in (A) of FIG. 4 is well known as a method for increasing the aperture ratio. As shown in (A) of FIG. 4, each of a plurality of unit pixels formed on a display panel 20 is disposed in a triangle shape and includes a red subpixel SPR, a green subpixel SPG, and a blue subpixel SPB, that are partitioned by a black region 21. This existing RGB delta structure is effective at increasing the aperture ratio. However, because the subpixels (for example, the green subpixels SPG) of the same color are disposed in zigzags in a column direction, a straight line is displayed in a wavy shape 22. Therefore, the display panel 20 having the existing RGB delta structure is unsuitable to display texts.

An RGBG structure shown in (B) of FIG. 4 is well known as another method for increasing the aperture ratio. As shown in (B) of FIG. 4, each of a plurality of pixel groups formed on a display panel 30 includes four unit pixels. Each pixel group includes 8 subpixels, i.e., 4 green subpixels SPG, 2 red subpixels SPR, and 2 blue subpixels SPB, that are partitioned by a black region 31. The existing RGBG structure is effective at increasing the aperture ratio. However, because the pixel group including the four unit pixels includes only the 2 red subpixels SPR and only the 2 blue subpixels SPB, an image displayed on the display panel 30 is not clear. Hence, the image quality thereof is reduced.

The embodiment of the invention arranges the subpixels using the following method, so as to solve the problems of the existing subpixel structures shown in FIG. 4 while increasing the aperture ratio through the delta arrangement of the subpixels.

In the first to fourth unit pixels PXL1-PXL4, openings of the red subpixels SPR and openings of the green subpixels SPG are aligned along the Y-axis direction. Because the openings of the red and green subpixels SPR and SPG relatively greatly contribute to a luminance, the alignment in the Y-axis direction, i.e., the vertical alignment greatly improves the display quality, particularly, text readability and also increases the image quality.

In the first to fourth unit pixels PXL1-PXL4, openings of the blue shared subpixels SPB are aligned along the X-axis direction and are staggered along the Y-axis direction. Even if the openings of the blue shared subpixels SPB are staggered as in the embodiment of the invention, the blue shared subpixels SPB do not greatly affect the display quality because of a relatively small contribution of the openings of the blue shared subpixels SPB to the luminance. The staggered structure of the blue shared subpixels SPB provides convenience to a process for forming the red and green light emitting layers using a fine metal mask (FMM) method.

The operation effect may be applied to the following example embodiments of the invention.

FIG. 5 illustrates openings 600 of a shadow mask aligned in the Y-axis direction for forming the green light emitting layer using the FMM method. In FIG. 5, the shadow mask for forming the red light emitting layer is aligned in the Y-axis direction. It is preferable, but not required, that the green and red subpixels SPG and SPR are not completely aligned in the X-axis direction so as to secure a process margin. The two green light emitting layers or the two red light emitting layers may be deposited through one opening 600 of the shadow mask. Because the openings 600 of the shadow mask are disposed in zigzags along the X-axis direction in conformity with the disposition configuration of the green subpixels or the red subpixels, the firmness of the shadow mask may be improved. Thus, because the size of the openings of the subpixels does not have to decrease so as to secure the process margin in a high resolution panel, the aperture ratio of the display panel entirely increases.

FIG. 6 illustrates openings 700 of a shadow mask aligned in the X-axis direction for forming the blue light emitting layer using the FMM method. One blue shared light emitting layer may be deposited through one opening 700 of the shadow mask. The openings 700 of the shadow mask are disposed in zigzags along the X-axis or Y-axis direction in conformity with the disposition configuration of the blue shared subpixels.

In the embodiment of the invention, FIG. 3 illustrates an example of the pixel group GPXL in which the first and second unit pixels PXL1 and PXL2 are respectively positioned on the third and fourth unit pixels PXL3 and PXL4. Other configurations may be used for the pixel group GPXL. For example, the first and second unit pixels PXL1 and PXL2 may be respectively positioned under the third and fourth unit pixels PXL3 and PXL4.

Figure 7:
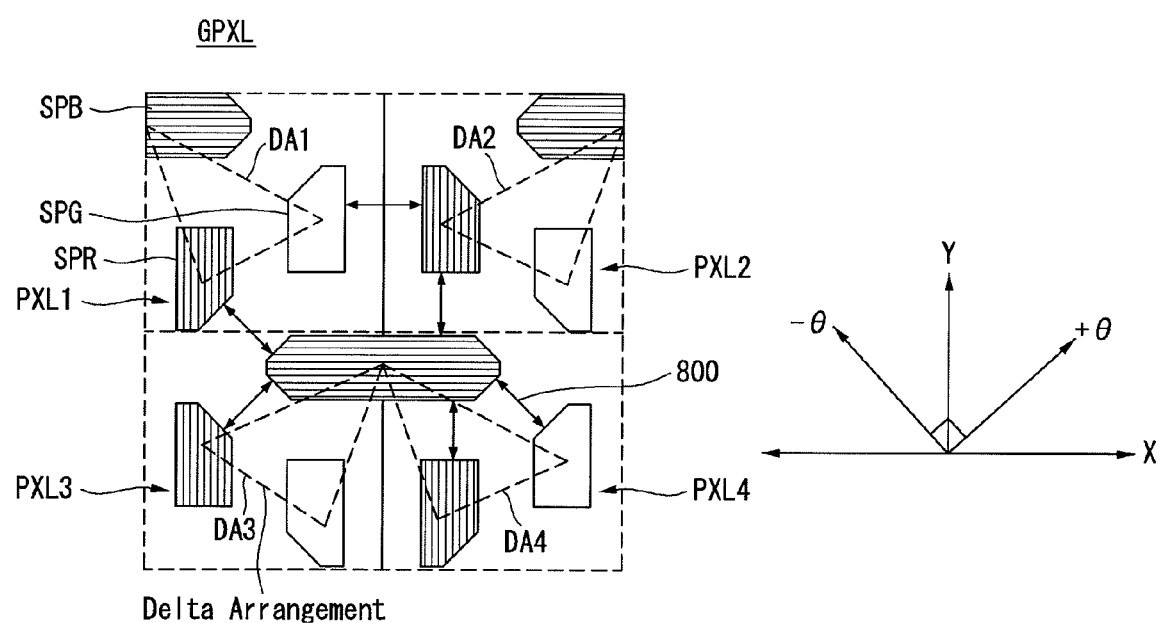
FIG. 7 illustrates a modification of a pixel group shown in FIG. 3.

FIG. 7 illustrates a modification of the pixel group GPXL shown in FIG. 3.

As shown in FIG. 7, a pixel group GPXL includes a first unit pixel PXL1, a second unit pixel PXL2 positioned adjacent to the first unit pixel PXL1 in the X-axis direction, a third unit pixel PXL3 positioned adjacent to the first unit pixel PXL1 in the Y-axis direction, and a fourth unit pixel PXL4 positioned adjacent to the second unit pixel PXL2 in the Y-axis direction.

The first unit pixel PXL1 includes a red subpixel SPR, a first blue shared subpixel SPB positioned at the upper side of the red subpixel SPR, and a green subpixel SPG positioned at the lateral side of the red subpixel SPR, thereby forming a first delta arrangement DA 1.

The second unit pixel PXL2 includes a red subpixel SPR, a green subpixel SPG positioned at the lateral side of the red subpixel SPR, and a second blue shared subpixel SPB positioned at the upper side of the green subpixel SPG, thereby forming a second delta arrangement DA2.

The third unit pixel PXL3 includes a red subpixel SPR, a green subpixel SPG positioned at the lateral side of the red subpixel SPR, and a third blue shared subpixel SPB positioned at the upper side of the green subpixel SPG, thereby forming a third delta arrangement DA3. The third delta arrangement DA3 is substantially the same as the second delta arrangement DA2.

The fourth unit pixel PXL4 includes a red subpixel SPR, the third blue shared subpixel SPB positioned at the upper side of the red subpixel SPR, and a green subpixel SPG positioned at the lateral side of the red subpixel SPR, thereby forming a fourth delta arrangement DA4. The fourth delta arrangement DA4 is substantially the same as the first delta arrangement DA 1.

The sizes of the blue shared subpixels SPB is about two times greater than the sizes of the red and green subpixels SPR and SPG. Unit pixels of other pixel groups sharing the first and second blue shared subpixels SPB are omitted in FIG. 7 for the sake of brevity. In FIG. 7, the unit pixels of the other pixel groups share the first and second blue shared subpixels SPB, substantially having the same size as the third blue shared subpixel SPB, with the first and second unit pixels shown in FIG. 7.

The first to fourth delta arrangements DA1-DA4 are obtained by virtually connecting central points (or internal points) of the red, green, and blue subpixels SPR, SPG, and SPB of each of the first to fourth delta arrangements DA1-DA4 to one another. A reason to arrange the subpixels of each of the first to fourth unit pixels PXL1-PXL4 in the delta structure is to increase the aperture ratio. In the embodiment of the invention, because two unit pixels positioned adjacent to each other in the X-axis direction share one blue subpixel with each other, the number of blue subpixels decreases. Hence, the number of TFTs and the number of signal lines required to constitute the blue subpixels decrease. As a result, the aperture ratio further increases.

The first and fourth delta arrangements DA1 and DA4 of the first and fourth unit pixels PXL1 and PXL4 are substantially the same as each other in a direction of a first inclined axis (i.e., −θ-axis direction). The second and third delta arrangements DA2 and DA3 of the second and third unit pixels PXL2 and PXL3 are substantially the same as each other in a direction of a second inclined axis (i.e., +θ-axis direction) perpendicular to the first inclined axis. Thus, the first and fourth unit pixels PXL1 and PXL4 have translational symmetry in the direction of the first inclined axis (i.e., −θ-axis direction), and the second and third unit pixels PXL2 and PXL3 have translational symmetry in the direction of the second inclined axis (i.e., +θ-axis direction).

Further, the first and second delta arrangements DA1 and DA2 of the first and second unit pixels PXL1 and PXL2 form the line symmetry with respect to the Y-axis direction. The third and fourth delta arrangements DA3 and DA4 of the third and fourth unit pixels PXL3 and PXL4 form the line symmetry with respect to the Y-axis direction.

In the first to fourth unit pixels PXL1-PXL4, openings of the red subpixels SPR and openings of the green subpixels SPG are aligned along the Y-axis direction. Because the openings of the red and green subpixels SPR and SPG relatively greatly contribute to the luminance, the alignment in the Y-axis direction, i.e., the vertical alignment greatly improves the display quality, particularly, the text readability and also increases the image quality.

In the first to fourth unit pixels PXL1-PXL4, openings of the blue shared subpixels SPB are aligned along the X-axis direction and are staggered along the Y-axis direction. Even if the openings of the blue shared subpixels SPB are staggered as in the embodiment of the invention, the blue shared subpixels SPB do not greatly affect the display quality because of a relatively small contribution of the openings of the blue shared subpixels SPB to the luminance. The staggered structure of the blue shared subpixels SPB provides convenience to the process for forming the red and green light emitting layers using the FMM method.

In the first to fourth unit pixels PXL1-PXL4, the subpixels may have a polygonal shape having five or more sides. For example, the red and green subpixels SPR and SPG may have a pentagonal shape, and the blue shared subpixels SPB may have an octagonal shape. In the embodiment of the invention, a reason to form the subpixels in the polygonal shape is to further increase the aperture ratio by keeping a distance between the subpixels of the different colors constant as indicated by an arrow 800 of FIG. 7. Further, another reason is to optimize the FMM process.

Figure 8:
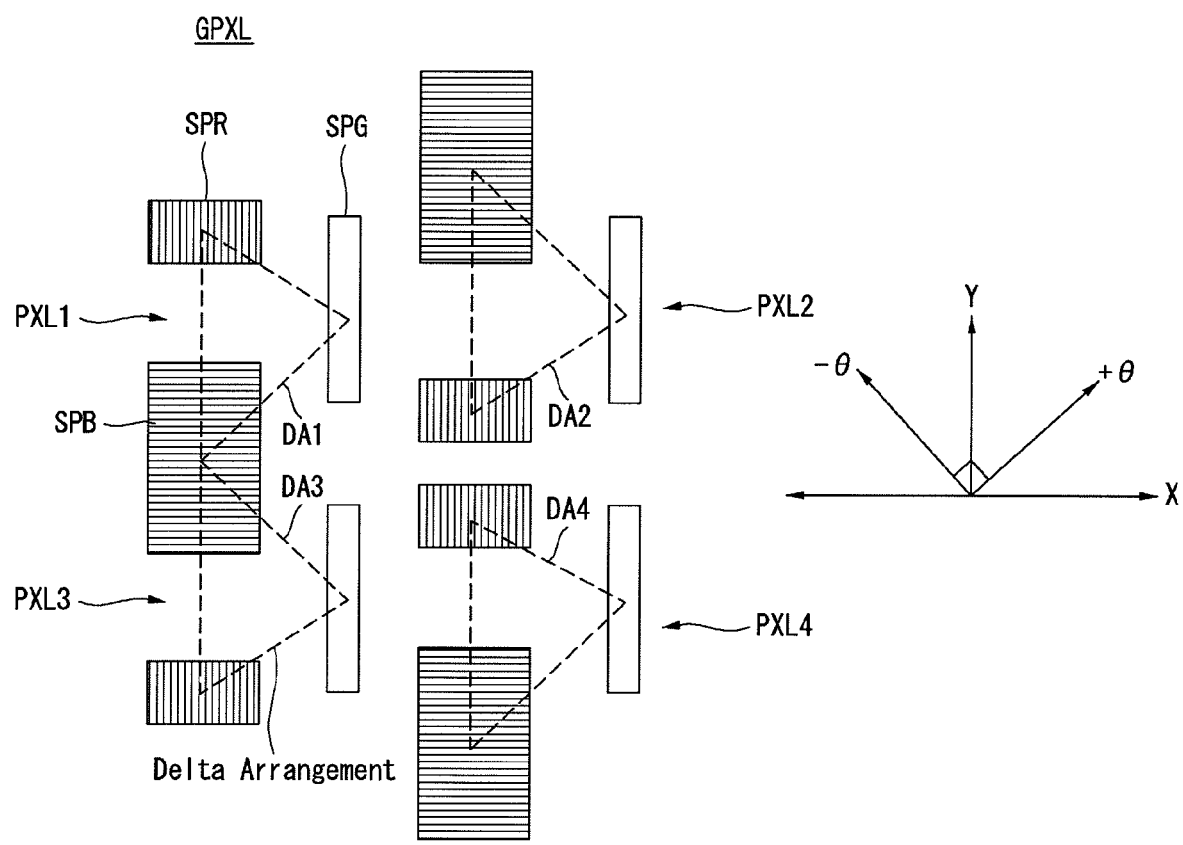
FIG. 8 illustrates one pixel group of a flat panel display device according to a second example embodiment of the invention.

FIG. 8 illustrates one pixel group of a flat panel display device according to a second example embodiment of the invention.

As shown in FIG. 8, a pixel group GPXL includes a first unit pixel PXL1, a second unit pixel PXL2 positioned adjacent to the first unit pixel PXL1 in the X-axis direction, a third unit pixel PXL3 positioned adjacent to the first unit pixel PXL1 in the Y-axis direction, and a fourth unit pixel PXL4 positioned adjacent to the second unit pixel PXL2 in the Y-axis direction.

Unlike the pixel groups GPXL shown in FIGS. 3 and 7, in the pixel group GPXL shown in FIG. 8, blue shared subpixels SPB as well as red and green subpixels SPR and SPG are aligned in the Y-axis direction. The two red subpixels SPR are disposed between every two blue shared subpixels SPB aligned in the Y-axis direction. In other words, one blue shared subpixel SPB and the two red subpixels SPR are alternately disposed along one column line. The green subpixels SPG are aligned between the column lines in the Y-axis direction.

Each of the green subpixels SPG is positioned opposite a portion of the red subpixel SPR adjacent to the green subpixel SPG and a portion of the blue shared subpixel SPB adjacent to the green subpixel SPG, so as to constitute the unit pixel.

In other words, an opening of the green subpixel SPG is positioned to overlap a portion of the red subpixel SPR adjacent to the green subpixel SPG and a portion of the blue shared subpixel SPB adjacent to the green subpixel SPG in a horizontal direction. When a portion of an upper part of the green subpixel SPG overlaps the red subpixel SPR positioned on the left side of the upper part of the green subpixel SPG and the blue shared subpixel SPB positioned on the right side of the upper part of the green subpixel SPG, a portion of a lower part of the green subpixel SPG overlaps the blue shared subpixel SPB positioned on the left side of the lower part of the green subpixel SPG and the red subpixel SPR positioned on the right side of the lower part of the green subpixel SPG. Further, when a portion of an upper part of the green subpixel SPG overlaps the blue shared subpixel SPB positioned on the left side thereof and the red subpixel SPR positioned on the right side thereof, a portion of a lower part of the green subpixel SPG overlaps the red subpixel SPR positioned on the left side thereof and the blue shared subpixel SPB positioned on the right side thereof. Thus, the first unit pixel PXL1 includes a red subpixel SPR, a first blue shared subpixel SPB positioned at the lower side of under the red subpixel SPR, and a green subpixel SPG, that is positioned at the lateral side of the red subpixel SPR and the first blue shared subpixel SPB to be partially opposite to a portion of the red subpixel SPR and a portion of the first blue shared subpixel SPB, thereby forming a first delta arrangement DA1.

The second unit pixel PXL2 includes a second blue shared subpixel SPB, a red subpixel SPR positioned at the lower side of the second blue shared subpixel SPB, and a green subpixel SPG, that is positioned at the lateral side of the second blue shared subpixel SPB and the red subpixel SPR to be partially opposite to a portion of the second blue shared subpixel SPB and a portion of the red subpixel SPR, thereby forming a second delta arrangement DA2.

The third unit pixel PXL3 includes the first blue shared subpixel SPB, a red subpixel SPR positioned at the lower side of the first blue shared subpixel SPB, and a green subpixel SPG, that is positioned at the lateral side of the first blue shared subpixel SPB and the red subpixel SPR to be partially opposite to a portion of the first blue shared subpixel SPB and a portion of the red subpixel SPR, thereby forming a third delta arrangement DA3. The third delta arrangement DA3 is substantially the same as the second delta arrangement DA2.

The fourth unit pixel PXL4 includes a red subpixel SPR, a third blue shared subpixel SPB positioned at the lower side of the red subpixel SPR, and a green subpixel SPG, that is positioned at the lateral side of the red subpixel SPR and the third blue shared subpixel SPB to be partially opposite to a portion of the red subpixel SPR and a portion of the third blue shared subpixel SPB, thereby forming a fourth delta arrangement DA4. The fourth delta arrangement DA4 is substantially the same as the first delta arrangement DA 1.

In the first to fourth unit pixels PXL1-PXL4, the red subpixels SPR may have a rectangular shape in which long sides thereof are positioned in the X-axis direction, and the green subpixels SPG and the blue shared subpixels SPB may have a rectangular shape in which long sides thereof are positioned in the Y-axis direction. The sizes of the blue shared subpixels SPB are greater than the sizes of the red and green subpixels SPR and SPG.

The first to fourth delta arrangements DA1-DA4 are obtained by virtually connecting central points (or internal points) of the red, green, and blue subpixels SPR, SPG, and SPB of each of the first to fourth delta arrangements DA1-DA4 to one another. A reason to arrange the subpixels of each of the first to fourth unit pixels PXL1-PXL4 in the delta structure is to increase the aperture ratio. In the embodiment of the invention, because two unit pixels positioned adjacent to each other in the Y-axis direction share one blue subpixel with each other, the number of blue subpixels decreases. Hence, the number of TFTs and the number of signal lines required to constitute the blue subpixels decrease. As a result, the aperture ratio further increases.

The first and fourth delta arrangements DA1 and DA4 of the first and fourth unit pixels PXL1 and PXL4 are substantially the same as each other in a direction of a first inclined axis (i.e., −θ-axis direction). The second and third delta arrangements DA2 and DA3 of the second and third unit pixels PXL2 and PXL3 are substantially the same as each other in a direction of a second inclined axis (i.e., +θ-axis direction) perpendicular to the first inclined axis. In the first to fourth delta arrangements DA1-DA4, vertices virtually corresponding to the central points (or internal points) of the green subpixels SPG face to the X-axis direction.

In the first to fourth unit pixels PXL1-PXL4, openings of the red subpixels SPR and openings of the green subpixels SPG are aligned along the Y-axis direction. Because the openings of the red and green subpixels SPR and SPG relatively greatly contribute to a luminance, the alignment in the Y-axis direction, i.e., the vertical alignment greatly improves the display quality, particularly, text readability and also increases the image quality.

In the first to fourth unit pixels PXL1-PXL4, the openings of the blue shared subpixels SPB are aligned along the Y-axis direction. Because the openings of the blue shared subpixels SPB as well as the openings of the red and green subpixels SPR and SPG are aligned along the Y-axis direction in the second example embodiment of the invention, it is easy to manufacture a metal mask used to form the light emitting layers.

Figure 9:
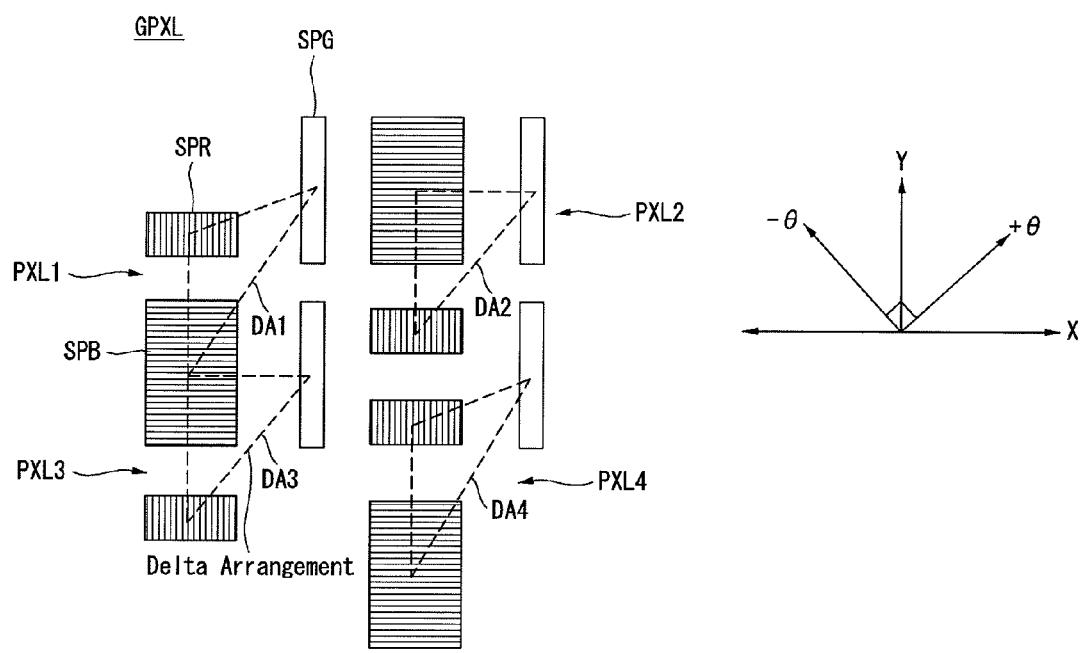
FIG. 9 illustrates one modification of a pixel group shown in FIG. 8.

FIG. 9 illustrates one modification of the pixel group GPXL shown in FIG. 8.

As shown in FIG. 9, a pixel group GPXL includes a first unit pixel PXL1, a second unit pixel PXL2 positioned adjacent to the first unit pixel PXL1 in the X-axis direction, a third unit pixel PXL3 positioned adjacent to the first unit pixel PXL1 in the Y-axis direction, and a fourth unit pixel PXL4 positioned adjacent to the second unit pixel PXL2 in the Y-axis direction.

In the pixel group GPXL shown in FIG. 9, blue shared subpixels SPB as well as red and green subpixels SPR and SPG are aligned in the Y-axis direction in the same manner as the pixel group GPXL shown in FIG. 8. The two red subpixels SPR are disposed between every two blue shared subpixels SPB aligned in the Y-axis direction. In other words, one blue shared subpixel SPB and the two red subpixels SPR are alternately disposed along one column line. The green subpixels SPG are aligned between the column lines in the Y-axis direction. Unlike the pixel group GPXL shown in FIG. 8, each of the green subpixels SPG is positioned opposite a portion of one of the red subpixel SPR and the blue shared subpixel SPB adjacent to each green subpixel SPG.

An opening of the green subpixel SPG horizontally overlaps the two red subpixels SPR on the left or right side of the green subpixel SPG on the same horizontal line and overlaps the blue shared subpixel SPB on the right or left side of the green subpixel SPG on the same horizontal line.

The first unit pixel PXL1 includes a red subpixel SPR, a first blue shared subpixel SPB positioned at the lower side of the red subpixel SPR, and a green subpixel SPG, that is positioned at the lateral side of the red subpixel SPR to be partially opposite to the red subpixel SPR, thereby forming a first delta arrangement DA1.

The second unit pixel PXL2 includes a second blue shared subpixel SPB, a red subpixel SPR positioned at the lower side of the second blue shared subpixel SPB, and a green subpixel SPG, that is positioned at the lateral side of the second blue shared subpixel SPB to be partially opposite to the second blue shared subpixel SPB, thereby forming a second delta arrangement DA2.

The third unit pixel PXL3 includes the first blue shared subpixel SPB, a red subpixel SPR positioned at the lower side of the first blue shared subpixel SPB, and a green subpixel SPG, that is positioned at the lateral side of the first blue shared subpixel SPB to be partially opposite to the first blue shared subpixel SPB, thereby forming a third delta arrangement DA3. The third delta arrangement DA3 is substantially the same as the second delta arrangement DA2.

The fourth unit pixel PXL4 includes a red subpixel SPR, a third blue shared subpixel SPB positioned at the lower side of the red subpixel SPR, and a green subpixel SPG, that is positioned at the lateral side of the red subpixel SPR to be partially opposite to the red subpixel SPR, thereby forming a fourth delta arrangement DA4. The fourth delta arrangement DA4 is substantially the same as the first delta arrangement DA 1.

In the first to fourth unit pixels PXL1-PXL4, the red subpixels SPR may have a rectangular shape in which long sides thereof are positioned in the X-axis direction, and the green subpixels SPG and the blue shared subpixels SPB may have a rectangular shape in which long sides thereof are positioned in the Y-axis direction. The sizes of the blue shared subpixels SPB are greater than the sizes of the red and green subpixels SPR and SPG.

The first to fourth delta arrangements DA 1-DA4 are obtained by virtually connecting central points (or internal points) of the red, green, and blue subpixels SPR, SPG, and SPB of each of the first to fourth delta arrangements DA1-DA4 to one another. A reason to arrange the subpixels of each of the first to fourth unit pixels PXL1-PXL4 in the delta structure is to increase the aperture ratio. In the embodiment of the invention, because two unit pixels positioned adjacent to each other in the Y-axis direction share one blue subpixel with each other, the number of blue subpixels decreases. Hence, the number of TFTs and the number of signal lines required to constitute the blue subpixels decrease. As a result, the aperture ratio further increases.

The first and fourth delta arrangements DA 1 and DA4 of the first and fourth unit pixels PXL1 and PXL4 are substantially the same as each other in a direction of a first inclined axis (i.e., −θ-axis direction). The second and third delta arrangements DA2 and DA3 of the second and third unit pixels PXL2 and PXL3 are substantially the same as each other in a direction of a second inclined axis (i.e., +θ-axis direction) perpendicular to the first inclined axis. In the first to fourth delta arrangements DA1-DA4, vertices virtually corresponding to the central points (or internal points) of the green subpixels SPG face to the X-axis direction.

In the first to fourth unit pixels PXL1-PXL4, openings of the red subpixels SPR and openings of the green subpixels SPG are aligned along the Y-axis direction. Because the openings of the red and green subpixels SPR and SPG relatively greatly contribute to a luminance, the alignment in the Y-axis direction, i.e., the vertical alignment greatly improves the display quality, particularly, the text readability and also increases the image quality.

In the first to fourth unit pixels PXL1-PXL4, the openings of the blue shared subpixels SPB are aligned along the Y-axis direction. Because the openings of the blue shared subpixels SPB as well as the openings of the red and green subpixels SPR and SPG are aligned along the Y-axis direction in the embodiment of the invention, it is easy to manufacture a metal mask used to form the light emitting layers.

Figure 10:
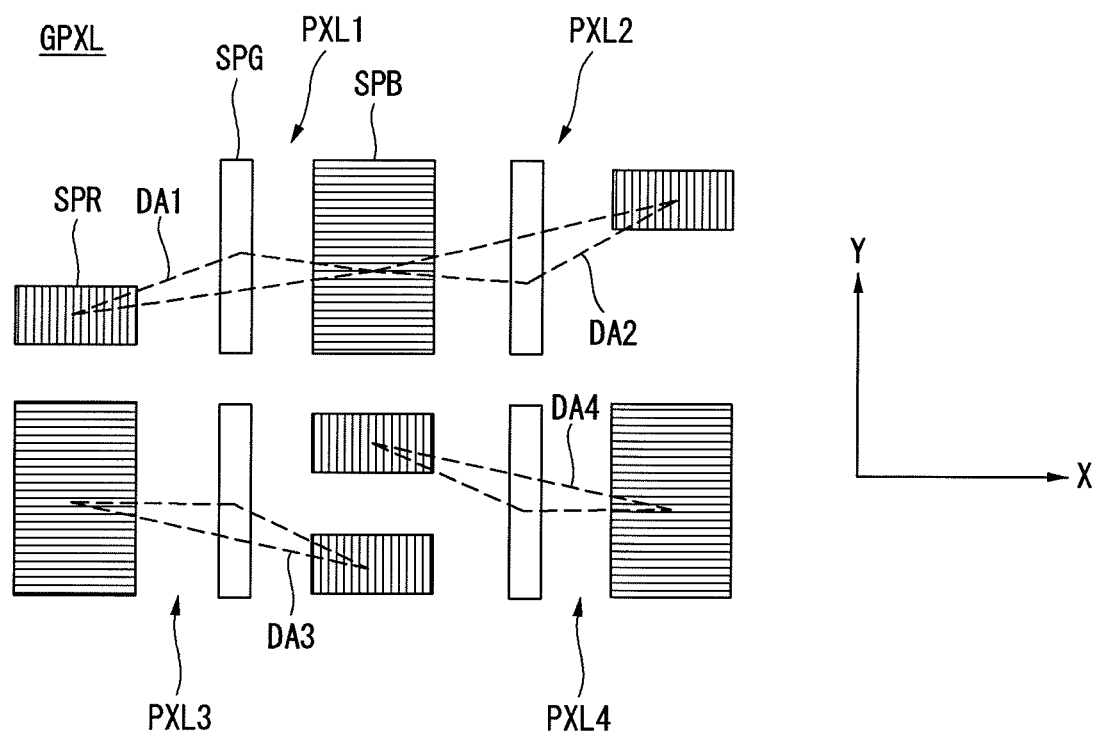
FIG. 10 illustrates the other modification of a pixel group shown in FIG. 8.

FIG. 10 illustrates the other modification of the pixel group GPXL shown in FIG. 8.

As shown in FIG. 10, a pixel group GPXL includes a first unit pixel PXL1, a second unit pixel PXL2 positioned adjacent to the first unit pixel PXL1 in the X-axis direction, a third unit pixel PXL3 positioned adjacent to the first unit pixel PXL1 in the Y-axis direction, and a fourth unit pixel PXL4 positioned adjacent to the second unit pixel PXL2 in the Y-axis direction.

In the pixel group GPXL shown in FIG. 10, blue shared subpixels SPB as well as red and green subpixels SPR and SPG are aligned in the Y-axis direction in the same manner as the pixel group GPXL shown in FIG. 8. The two red subpixels SPR are disposed between every two blue shared subpixels SPB aligned in the Y-axis direction. In other words, one blue shared subpixel SPB and the two red subpixels SPR are alternately disposed along one column line. The green subpixels SPG are aligned between the column lines in the Y-axis direction. Unlike the pixel group GPXL shown in FIG. 9, each of the green subpixels SPG is positioned opposite to the red subpixel SPR and the blue shared subpixel SPB leftly or rightly adjacent to each green subpixel SPG.

An opening of the green subpixel SPG horizontally overlaps the two red subpixels SPR on the left or right side of the green subpixel SPG on the same horizontal line and overlaps the blue shared subpixel SPB on the right or left side of the green subpixel SPG on the same horizontal line.

The first unit pixel PXL1 includes a green subpixel SPG, a red subpixel SPR positioned at the left side of the green subpixel SPG, and a first blue shared subpixel SPB positioned at the right side of the green subpixel SPG, thereby forming a first delta arrangement DA1. In the first unit pixel PXL1, the red subpixel SPR is opposite to the lower portion of the green subpixel SPG horizontally.

The second unit pixel PXL2 includes a green subpixel SPG, the first blue shared subpixel SPB positioned at the left side of the green subpixel SPG, and a red subpixel SPR positioned at the right side of the green subpixel SPG, thereby forming a second delta arrangement DA2. In the second unit pixel PXL2, the red subpixel SPR is opposite to the upper portion of the green subpixel SPG horizontally.

The third unit pixel PXL3 includes a green subpixel SPG, a second blue shared subpixel SPB positioned at the left side of the green subpixel SPG, and a red subpixel SPR positioned at the right side of the green subpixel SPG, thereby forming a third delta arrangement DA3. In the third unit pixel PXL3, the red subpixel SPR is opposite to the lower portion of the green subpixel SPG horizontally.

The fourth unit pixel PXL4 includes a green subpixel SPG, a red subpixel SPR positioned at the left side of the green subpixel SPG, and a third blue shared subpixel SPB positioned at the right side of the green subpixel SPG, thereby forming a fourth delta arrangement DA4. In the fourth unit pixel PXL4, the red subpixel SPR is opposite to the upper portion of the green subpixel SPG horizontally.

In the first to fourth unit pixels PXL1-PXL4, the red subpixels SPR may have a rectangular shape in which long sides thereof are positioned in the X-axis direction, and the green subpixels SPG and the blue shared subpixels SPB may have a rectangular shape in which long sides thereof are positioned in the Y-axis direction. The sizes of the blue shared subpixels SPB are greater than the sizes of the red and green subpixels SPR and SPG.

The first to fourth delta arrangements DA1-DA4 are obtained by virtually connecting central points of the red, green, and blue subpixels SPR, SPG, and SPB of each of the first to fourth delta arrangements DA1-DA4 to one another. A reason to arrange the subpixels of each of the first to fourth unit pixels PXL1-PXL4 in the delta structure is to increase the aperture ratio. In the embodiment of the invention, because two unit pixels positioned adjacent to each other in the X-axis direction share one blue subpixel with each other, the number of blue subpixels decreases. Hence, the number of TFTs and the number of signal lines required to constitute the blue subpixels decrease. As a result, the aperture ratio further increases.

The first and fourth delta arrangements DA1 and DA4 of the first and fourth unit pixels PXL1 and PXL4 are substantially the same as each other in a direction of a first inclined axis (i.e., −θ-axis direction). The second and third delta arrangements DA2 and DA3 of the second and third unit pixels PXL2 and PXL3 are substantially the same as each other in a direction of a second inclined axis (i.e., +θ-axis direction) perpendicular to the first inclined axis. In the first to fourth delta arrangements DA1-DA4, vertices virtually corresponding to the central points of the green subpixels SPG face to the X-axis direction.

In the first to fourth unit pixels PXL1-PXL4, openings of the red subpixels SPR and openings of the green subpixels SPG are aligned along the Y-axis direction. Because the openings of the red and green subpixels SPR and SPG relatively greatly contribute to a luminance, the alignment in the Y-axis direction, i.e., the vertical alignment greatly improves the display quality, particularly, the text readability and also increases the image quality.

In the first to fourth unit pixels PXL1-PXL4, the openings of the blue shared subpixels SPB are aligned along the Y-axis direction. Because the openings of the blue shared subpixels SPB as well as the openings of the red and green subpixels SPR and SPG are aligned along the Y-axis direction in the embodiment of the invention, it is easy to manufacture a metal mask used to form the light emitting layers.

As described above, the subpixel arrangement structure of the flat panel display device according to the embodiments of the invention may prevent a reduction in display quality while increasing the aperture ratio and the luminance. For example, the flat panel display device according to the embodiment of the invention may obtain a luminance of 150 cd/m² under the same process conditions as the existing RGB stripe structure without causing the reduction in display quality, as compared to a luminance of 100 cd/m² obtained in the existing RGB stripe structure.

Furthermore, the flat panel display device according to the embodiments of the invention may further increase the aperture ratio through the structure in which the two unit pixels positioned adjacent to each other in the direction of the row axis or the column axis share one blue subpixel with each other.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A subpixel arrangement structure for a display device, comprising:
    a plurality of pixel groups each of which comprises four unit pixels,
    wherein the four unit pixels includes a first unit pixel, a second unit pixel positioned adjacent to the first unit pixel in a direction of a row axis, a third unit pixel positioned adjacent to the first unit pixel in a direction of a column axis that is perpendicular to the row axis, and a fourth unit pixel positioned adjacent to the second unit pixel in the direction of the column axis,
    wherein each unit pixel has a red subpixel, a green subpixel and a blue subpixel which form a delta arrangement structure, wherein openings of the red and green subpixels of each unit pixel are substantially aligned along the direction of the column axis,
    wherein an opening of the blue subpixel of each unit pixel are substantially aligned along the direction of the column axis and staggered along the direction of the row axis or are substantially aligned along the direction of the row axis and staggered along the direction of the column axis, and
    wherein two of the unit pixels, that are positioned adjacent to each other in the direction of the column axis or the direction of the row axis, share one blue subpixel with each other,
    wherein the first unit pixel includes a first red subpixel, a first green subpixel positioned at the lateral side of the first red subpixel, and a first blue shared subpixel positioned at the lower side of the first green subpixel, thereby forming a first delta arrangement,
    wherein the second unit pixel includes a second red subpixel, a second green subpixel positioned at the lateral side of the second red subpixel, and the first blue shared subpixel positioned at the lower side of the second red subpixel, thereby forming a second delta arrangement,
    wherein the third unit pixel includes a third red subpixel, a third green subpixel positioned at the lateral side of the third red subpixel, and a second blue shared subpixel positioned at the lower side of the third red subpixel, thereby forming a third delta arrangement, that is substantially the same as the second delta arrangement, and
    wherein the fourth unit pixel includes a fourth red subpixel, a fourth green subpixel positioned at the lateral side of the fourth red subpixel, and a third blue shared subpixel positioned at the lower side of the fourth green subpixel, thereby forming a fourth delta arrangement, that is substantially the same as the first delta arrangement.

2. The subpixel arrangement structure of claim 1, wherein the first to fourth red subpixels and the first to fourth green subpixels have a rectangular shape in which long sides thereof are positioned in the direction of the column axis, and the first to third blue shared subpixels have a rectangular shape in which long sides thereof are positioned in the direction of the row axis,
    wherein the first to third blue shared subpixels are aligned along the direction of the row axis, and
    wherein sizes of the first to third blue shared subpixels are greater than sizes of the first to fourth red subpixels and sizes of the first to fourth green subpixels.

3. The subpixel arrangement structure of claim 1, wherein the first and second delta arrangements of the first and second unit pixels form the line symmetry with respect to the column axis, and
    wherein the third and fourth delta arrangements of the third and fourth unit pixels form the line symmetry with respect to the column axis.

4. The subpixel arrangement structure of claim 1, wherein each of the plurality of pixel groups includes ten subpixels within the four unit pixels.

5. The subpixel arrangement structure of claim 1,
    wherein two of the plurality of unit pixels that are positioned adjacent to each other in the direction of the row axis share the one blue subpixel with each other when the one blue subpixel is aligned along the direction of the row axis.

6. The subpixel arrangement structure of claim 1, wherein a subpixel arrangement of the first unit pixel is the same as that of the fourth unit pixel, and a subpixel arrangement of the second unit pixel is the same as that of the third unit pixel.

7. A subpixel arrangement structure for a display device, comprising:
    a plurality of pixel groups each of which comprises four unit pixels,
    wherein the four unit pixels includes a first unit pixel, a second unit pixel positioned adjacent to the first unit pixel in a direction of a row axis, a third unit pixel positioned adjacent to the first unit pixel in a direction of a column axis that is perpendicular to the row axis, and a fourth unit pixel positioned adjacent to the second unit pixel in the direction of the column axis,
    wherein each unit pixel has a red subpixel, a green subpixel and a blue subpixel which form a delta arrangement structure, wherein openings of the red and green subpixels of each unit pixel are substantially aligned along the direction of the column axis,
    wherein an opening of the blue subpixel of each unit pixel are substantially aligned along the direction of the column axis and staggered along the direction of the row axis or are substantially aligned along the direction of the row axis and staggered along the direction of the column axis, and
    wherein two of the unit pixels, that are positioned adjacent to each other in the direction of the column axis or the direction of the row axis, share one blue subpixel with each other, wherein the first unit pixel includes a first red subpixel, and a first blue shared subpixel positioned at the upper side of the first red subpixel, and a first green subpixel positioned at the lateral side of the first red subpixel, thereby forming a first delta arrangement, wherein the second unit pixel includes a second red subpixel, a second green subpixel positioned at the lateral side of the second red subpixel, and a second blue shared subpixel positioned at the upper side of the second green subpixel, thereby forming a second delta arrangement, wherein the third unit pixel includes a third red subpixel, a third green subpixel positioned at the lateral side of the third red subpixel, and a third blue shared subpixel positioned at the upper side of the third green subpixel, thereby forming a third delta arrangement, that is substantially the same as the second delta arrangement, and wherein the fourth unit pixel includes a fourth red subpixel, the third blue shared subpixel positioned at the upper side of the fourth red subpixel, and a fourth green subpixel positioned at the lateral side of the fourth red subpixel, thereby forming a fourth delta arrangement, that is substantially the same as the first delta arrangement.

8. The subpixel arrangement structure of claim 7, wherein the first to fourth red subpixels and the first to fourth green subpixels have a polygonal shape, and the first to third blue shared subpixels have an octagonal shape, wherein the first to third blue shared subpixels are aligned along the direction of the row axis, and wherein sizes of the first to third blue shared subpixels are greater than sizes of the first to fourth red subpixels and sizes of the first to fourth green subpixels.

9. The subpixel arrangement structure of claim 7, wherein the first and second delta arrangements of the first and second unit pixels form the line symmetry with respect to the column axis, and wherein the third and fourth delta arrangements of the third and fourth unit pixels form the line symmetry with respect to the column axis.

10. The subpixel arrangement structure of claim 7, wherein each of the plurality of pixel groups includes ten subpixels within the four unit pixels.

11. The subpixel arrangement structure of claim 7, wherein two of the plurality of unit pixels that are positioned adjacent to each other in the direction of the row axis share the one blue subpixel with each other when the one blue subpixel is aligned along the direction of the row axis.

12. The subpixel arrangement structure of claim 7, wherein a subpixel arrangement of the first unit pixel is the same as that of the fourth unit pixel, and a subpixel arrangement of the second unit pixel is the same as that of the third unit pixel.

* * * * *